(12) United States Patent
Jovovic et al.

(10) Patent No.: US 7,222,424 B2
(45) Date of Patent: May 29, 2007

(54) METHOD FOR PRODUCING A TUBULAR SPRING AND AN ACTUATOR UNIT COMPRISING ONE SUCH TUBULAR SPRING

(75) Inventors: Dejan Jovovic, Regensburg (DE);
Günter Lewentz, Regensburg (DE);
Andreas Voigt, Regensburg (DE);
Claus Zumstrull, Regenstauf (DE)

(73) Assignee: Siemens Aktiengesellschaft, Munich (DE)

( * ) Notice: Subject to any disclaimer, the term of this patent is extended or adjusted under 35 U.S.C. 154(b) by 105 days.

(21) Appl. No.: 10/821,775

(22) Filed: Apr. 9, 2004

(65) Prior Publication Data

US 2004/0195060 A1 Oct. 7, 2004

Related U.S. Application Data

(63) Continuation of application No. PCT/DE02/03718, filed on Oct. 1, 2002.

(30) Foreign Application Priority Data

Oct. 9, 2001 (DE) ................. 101 49 746

(51) Int. Cl.
*B23P 15/16* (2006.01)
*B21D 51/16* (2006.01)
(52) U.S. Cl. ............... 29/896.6; 29/896.9; 29/890.12
(58) Field of Classification Search ............. 29/896.6, 29/896.9, 890.12, 25.35; 267/181
See application file for complete search history.

(56) References Cited

U.S. PATENT DOCUMENTS

| 4,460,842 A | * | 7/1984 | Waanders et al. ........... 310/338 |
| 4,826,143 A | | 5/1989 | Latorre et al. .............. 267/148 |
| 4,858,897 A | * | 8/1989 | Irifune ..................... 267/181 |
| 4,919,403 A | | 4/1990 | Bartholomew .............. 267/165 |
| 6,446,606 B1 | * | 9/2002 | Krimmer et al. ........... 123/458 |
| 2002/0086199 A1 | | 7/2002 | Gibb et al. .................. 429/37 |

FOREIGN PATENT DOCUMENTS

| DE | 19901530 | * | 7/2000 |
| EP | 0 514 825 A1 | | 5/1992 |
| FR | 10900004 | * | 3/1955 |
| JP | 57-149085 | * | 9/1982 |
| SU | 1031652 | * | 7/1983 |
| WO | WO 00/08353 | | 2/2000 |

OTHER PUBLICATIONS

EP 514825 Derwent Abstract.*
WO 20003/08353 Derwent Abstract.*

* cited by examiner

*Primary Examiner*—Marc Jimenez
(74) *Attorney, Agent, or Firm*—Baker Botts L.L.P.

(57) ABSTRACT

A method for producing a tubular spring (12) in the form of a cylindrical hollow body, especially for pre-tensioning a piezoelectric actuator element (2) of an actuator unit (1) of a fuel injector comprises the step of providing a thin-walled, solid-drawn steel tube with a plurality of regularly arranged longish recesses (14) by means of laser cutting. Thus, an actuator unit (1) comprises a piezoelectric actuator element (2) which is arranged in a thin-walled cylindrical hollow body, wherein the hollow body being elastically embodied and pre-tensioning the actuator element (2). Furthermore, the hollow body is a solid-drawn steel tube which is provided with a plurality of longish recesses (14).

7 Claims, 2 Drawing Sheets

FIG 1
FIG 2
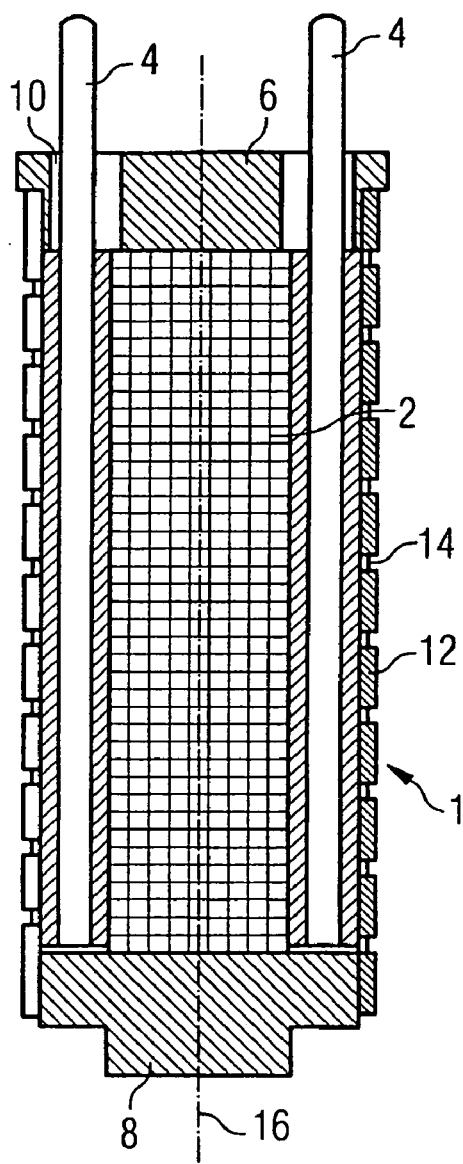
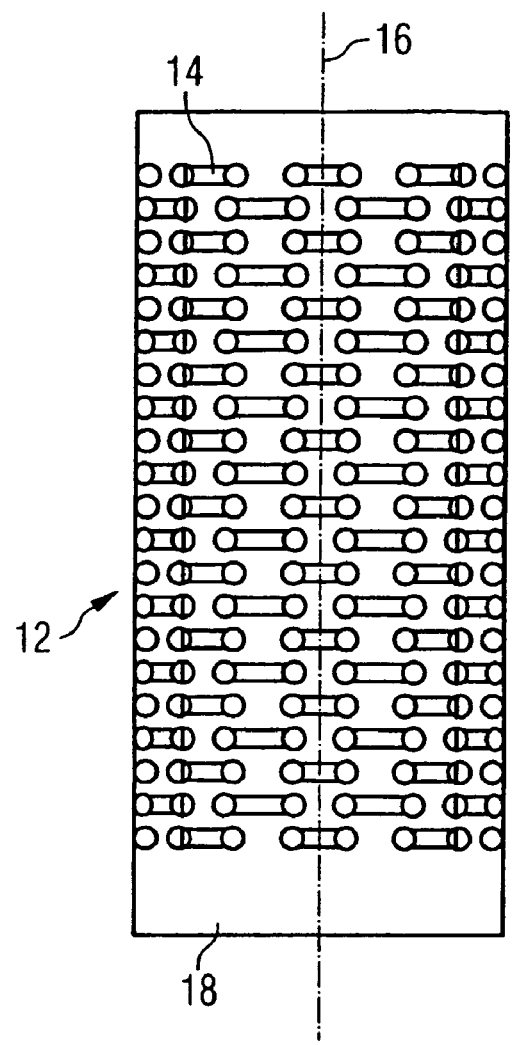

US 7,222,424 B2

METHOD FOR PRODUCING A TUBULAR SPRING AND AN ACTUATOR UNIT COMPRISING ONE SUCH TUBULAR SPRING

CROSS REFERENCE TO RELATED APPLICATION

This application is a continuation of copending International Application No. PCT/DE02/03718 filed Oct. 1, 2002 which designates the United States, and claims priority to German application no. 101 49 746.6 filed Oct. 9, 2001.

TECHNICAL FIELD OF THE INVENTION

The invention relates to a method for producing a tubular spring, more specifically for an actuator unit of a fuel injector, and an actuator of this kind comprising a tubular spring.

DESCRIPTION OF THE RELATED ART

The new generation of fuel injection systems have piezo-actuator elements as switching and actuating devices. These so-called piezo stacks comprising piezo units disposed one on top of the other are elastically preloaded for durability reasons. The preloading elements used for this purpose must apply very high preloading forces and be of compact size. Moreover, they must exhibit a relatively low spring constant and be of simple and rugged design. Durability with respect to high dynamic loading is additionally required.

DE 38 44 134 A1 discloses an injection valve with a piezoelectric actuator. The actuator is disposed in a cylindrical tubular spring by means of which it is preloaded against the injection valve housing. With this actuator unit design, however, the preloading of the piezoelectric actuator is heavily dependent on the manufacturing tolerances of the injector valve housing. Moreover, mounting the actuator unit is time consuming and requires a high degree of maintenance, as the preload exerted on the piezoelectric actuator by the tubular spring must be re-adjusted each time the unit is fitted and removed. With the tubular springs used, there is the additional problem that, in order to achieve sufficient elasticity of longitudinal movement of the piezoelectric actuator, the tubular spring must be extremely thin-walled, which adversely affects the strength and service life of the actuator unit.

A generic tubular spring for preloading a piezoelectric actuator of a fuel injection valve is also known from DE 198 35 628 A1. This tubular spring consists of a thin-walled hollow cylinder in which there are introduced a plurality of bone-shaped cutouts. These cutouts produce a desired degree of longitudinal flexibility of the tubular spring. This known tubular spring is relatively expensive to manufacture, as the cutouts are produced in a punching process. In addition, after said punching process a flat steel sheet must be formed into a cylindrical shape and welded at its abutting edge.

SUMMARY OF THE INVENTION

One object of the invention is to provide a method for producing a preloading element having a high elasticity for an actuator element of an actuator unit.

This object of the invention can be achieved by a method for producing a tubular spring in the form of a hollow body, in particular for preloading a piezoelectric actuator element of an actuator unit of a fuel injector, comprising the step of providing a tube, in particular a thin-walled seamless drawn steel tube, with a plurality of regularly disposed oblong cutouts by means of beam/jet cutting.

The beam/jet cutting can be performed by a method selected from the group consisting of laser beam, waterjet or electron beam cutting. During beam/jet cutting a filler can be inserted in the hollow body. A longitudinal extension direction of each cutout can be in each case essentially oriented perpendicularly to a cylinder center line of the tubular spring. The cutouts can be disposed in rows, the cutouts of adjacent rows each being laterally offset to one another. A minimum distance between adjacent cutouts of two rows can be 0.3 to four times the wall thickness of the cylindrical hollow body of the tubular spring. The seamless drawn steel tube used for the tubular spring may have a thickness of less than 1.0 millimeters. A spring steel can be used as the material of the seamless drawn steel tube used for the tubular spring. The tubular spring can be provided with cutouts which more specifically have dumbbell-shaped outlines with a narrowed-down central area.

The object can also be achieved by an actuator unit comprising a piezoelectric actuator element disposed in a thin-walled cylindrical hollow body, wherein said hollow body being elastically implemented and preloading the actuator element, and the hollow body being a steel tube provided with a plurality of cutouts.

The object can also be achieved by an actuator unit comprising a tubular spring in the form of a hollow body for preloading a piezoelectric actuator element of an actuator unit of a fuel injector, said tubular spring manufactured as a thin-walled seamless drawn steel tube, with a plurality of regularly disposed beam/jet cut oblong cutouts.

A longitudinal extension direction of each cutout can be in each case essentially oriented perpendicularly to a cylinder center line of the tubular spring. The cutouts can be disposed in rows, the cutouts of adjacent rows each being laterally offset to one another. A minimum distance between adjacent cutouts of two rows can be 0.3 to four times the wall thickness of the cylindrical hollow body of the tubular spring. The seamless drawn steel tube used for the tubular spring may have a thickness of less than 1.0 millimeters. A spring steel can be used as the material of the seamless drawn steel tube used for the tubular spring. The tubular spring can be provided with cutouts which more specifically have dumbbell-shaped outlines with a narrowed-down central area.

Accordingly, in a method for producing a tubular spring in the form of a hollow body, more specifically for preloading a piezoelectric actuator element of an actuator unit of a fuel injector, a thin-walled metal tube is provided with a plurality of regularly disposed oblong cutouts by means of beam/jet cutting.

The oblong-shaped cutouts ensure that the hollow body exhibits sufficient strength even at the preloads generally applied to the piezoelectric actuator of approx. 800 to 1000 N and is at the same time sufficiently elastic to execute the longitudinal movements produced by the piezoelectric actuator. Using beam/jet cutting, it is possible to make very small, narrow cutouts in the cylindrical hollow body which could not be made in this shape using a punching process. This means that significantly more cutouts can be accommodated on the same area, resulting in a significant reduction in the spring rate of the jet-cut variant of the tubular spring. On the other hand, because of the required minimum dimensions of the punch and the associated punching time of the punching tool, typical dimensions of punched cutouts are specified within relatively tight limits. This means that with punched cutouts the number of cutouts per unit area is also limited, resulting in a relatively high spring rate.

Because of the relatively low spring constant of the jet-cut tubular spring, only a very small part of the kinetic energy realized by the actuator is lost due to the spring constant of the preloading element as effective displacement.

The hollow body can preferably have a cylindrical outline. A possible material for the hollow body is more specifically a thin-walled, seamless drawn steel tube.

Suitable beam/jet cutting methods include laser beam cutting, waterjet cutting or electron beam cutting. All these beam/jet cutting methods can be carried out with high precision and produce very exact and dimensionally stable workpieces.

A first embodiment of the method according to the invention provides that, by using a suitable filler inside the hollow cylinder during beam/jet cutting, a defined shaping of the beam/jet outlet edge is achieved and damage to the opposite side is prevented.

Another preferred variant of the method according to the invention provides that a longitudinal expansion direction of each cutout is in each case aligned essentially perpendicularly to the cylinder center line of the tubular spring. In this way a required spring constant can be imprinted on the tubular spring in the direction of its longitudinal axis. According to another embodiment of the invention, the cutouts are disposed in rows, the cutouts of adjacent rows each being laterally offset to one another. This arrangement has the advantage of providing ideal tubular spring compliance, as the alternately meeting spaces and cutouts can result in a possible pressing-in of the cutouts, with the intervening spaces being able to retain their shape in each case.

According to another variant according to the invention, a minimum distance between adjacent cutouts of two rows is 0.3 to 4 times the wall thickness of the hollow body of the tubular spring. An ideal spring constant can be selected depending on the selected dimensions of the cutouts and the wall thickness of the tubular spring.

The inventive implementation of the tubular spring offers the possibility of selecting between a relatively large number of possible materials, as a loading reduction is possible with the spring rate remaining unchanged. Thus, for example, materials can be selected which, although having low strength, represent the best possible material pairing for subsequent welding processes. In addition, materials can also be selected which are optimally suited to the jet-cutting operation or the laser-cutting process, i.e. those having a relatively low sulfur content of less than 0.25%.

The seamless drawn metal tube used for the tubular spring preferably has a thickness of less than 1.0 mm. However, a greater thickness can also optionally be selected as a means of achieving a required spring constant even when using a lower-strength steel.

The seamless drawn metal tube used for the tubular spring is preferably a spring steel, as such a steel has relatively favorable elastic properties even in the case of very small dimensions.

According to a variant of the method according to the invention, the cutouts can each have a dumbbell-shaped outline with a narrowed-down central area, by means of which the required spring constant can in turn be selectively influenced.

To summarize, the advantages of the method according to the invention are as follows: By using a beam/jet cutting method, a high degree of precision of the tubular spring cutouts can be achieved. Apart from the beam/jet cutting, no additional processing steps are required. Moreover, a high surface quality in the cutouts can be obtained that would not achievable by means of punching.

The use of seamless drawn steel tubes allows improved dimensional stability of the required cylindrical outline of the tubular spring. As there is no longitudinal weld, as is necessary in the case of known methods, fewer potential defects are produced in the metal. In addition, the usually necessary weld machining can be omitted.

An actuator unit according to the invention has a thin-walled cylindrical hollow body disposed around a piezoelectric actuator element, the hollow body being elastically implemented and preloading the actuator element, and the hollow body being a metal tube, more specifically a seamless drawn steel tube, provided with a plurality of oblong cutouts. An actuator unit having such a cylindrical hollow body as a tubular spring can be provided with very precisely selected tubular spring properties.

BRIEF DESCRIPTION OF THE DRAWINGS

The invention will now be explained in greater detail with reference to embodiments and the accompanying drawings in which:

FIG. 1 shows a schematic cross-sectional view of an actuator unit,

FIG. 2 shows a schematic side view of a tubular spring produced using the method according to the invention.

DETAILED DESCRIPTION OF THE PREFERRED EMBODIMENTS

Figure 3:
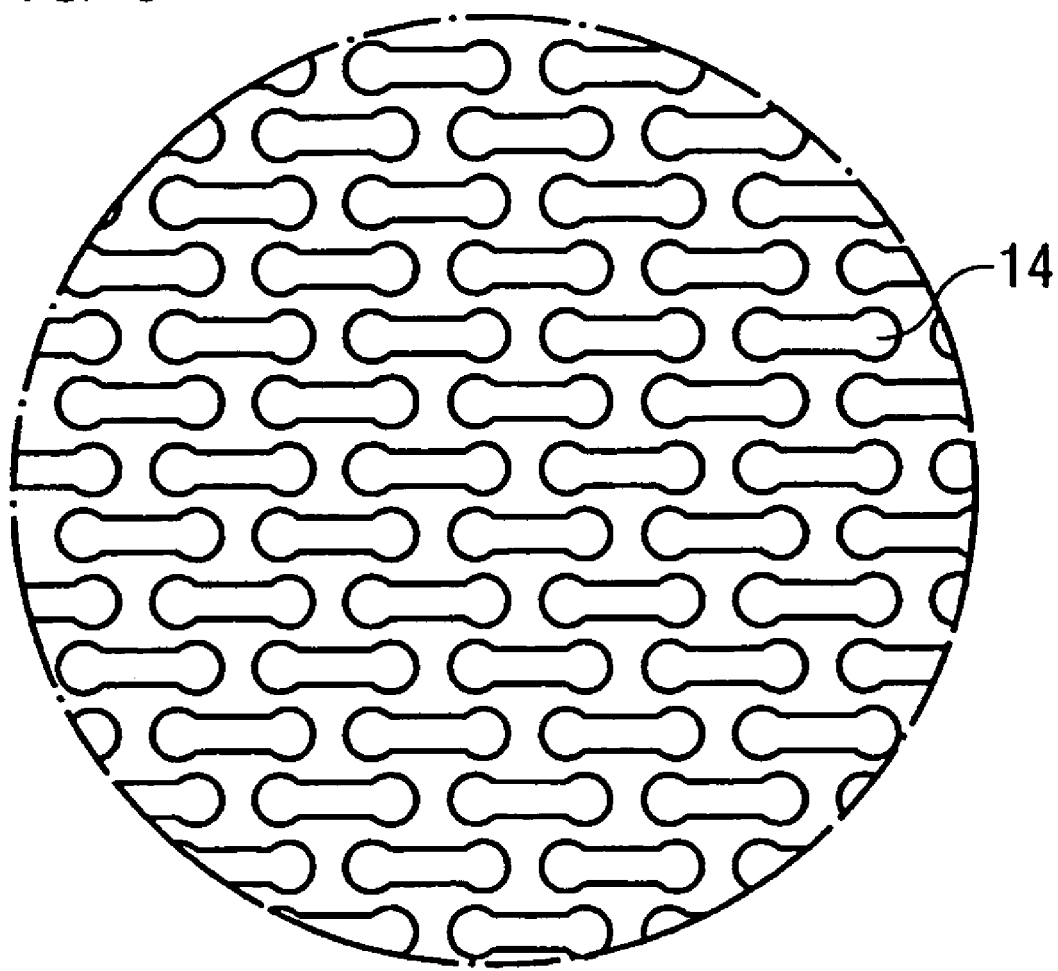
FIG. 3 shows a detail view of a first embodiment of the tubular spring according to FIG. 2.

FIG. 1 shows an actuator unit 1 consisting of a plurality of stacked individual piezoelectric elements. Electrical voltage is applied to the piezoelectric actuator unit 1 by means of contact pins 4. The contact pins 4 are each disposed along the actuator unit 1 and are in electrical contact with the actuator element 2. By applying a voltage between the contact pins 4, a longitudinal expansion of the piezoelectric actuator element 2 is produced which can be used e.g. for actuating an injection valve of an internal combustion engine. The piezoelectric actuator element 2 with the contact pins 4 is disposed in a cylindrical hollow body implemented as a tubular spring 12.

The end faces of the piezoelectric actuator element 2 bear on a cover plate 6 or base plate 8 as applicable, the upper cover plate 6 having bushings 10 through which the contact pins 4 extend. The cover plate 6 and the base plate 8 are each connected to the tubular spring 12 with a form and/or force fit, preferably by welding. Alternatively, the connection between the tubular spring 12 and the two plates 6, 8 can be established using a flanging, the flanged upper and lower edge areas of the hollow body engaging in the cover plate 6 and base plate 8 respectively. The piezoelectric actuator element 2 is preloaded with a defined force of preferably 800 to 1000 N by the two plates 6, 8 which are fixed in position by the tubular spring 12. In order to be able to maintain this preload, the hollow body accommodating the piezoelectric actuator element 2 is preferably made of spring steel, as spring steel is characterized by high strength. Alternatively, however, other materials can also be used, e.g. low elastic modulus materials such as copper-beryllium alloys.

FIG. 2 shows a side view of the tubular spring 12. The tubular spring 12 is a cylindrical hollow body made from a metal tube. In a cylindrical surface 18 of the tubular spring 12 there are provided a plurality of cutouts 14 produced by laser cutting. The oblong cutouts are each essentially perpendicularly oriented to the center line 16 of the tubular spring 12. The cutouts 14 are disposed in rows, the cutouts 14 of adjacent rows each being disposed laterally offset to one another. The minimum distance between adjacent cutouts of two rows is 0.3 to 4 times the wall thickness of the hollow body of the tubular spring.

More specifically, a seamless drawn steel tube, e.g. made of spring steel, can be used.

FIG. 3 shows a detail view of the cylindrical surface 18, provided with cutouts 14, of the tubular spring 12 according to FIG. 2, the cutouts 14 being lobe-shaped so that they each have a narrowed-down central area. This shape has a favorable effect on material stressing and therefore allows low spring constants for the tubular spring 12 as a whole.

Figure 4:
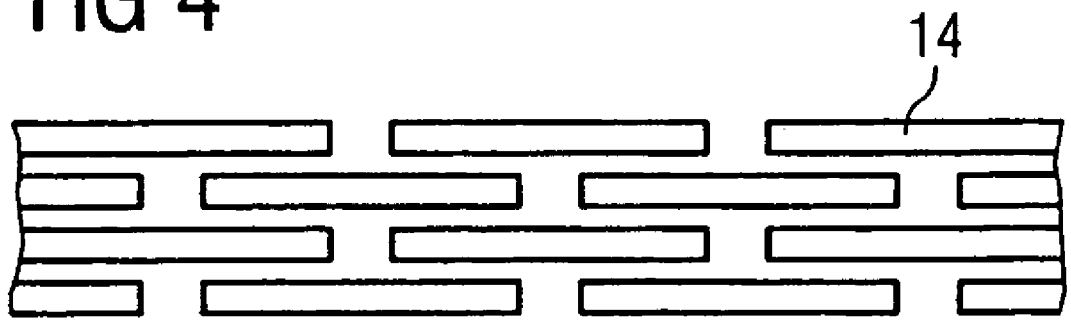
FIG. 4 shows a detail view of an alternative embodiment of the tubular spring.

The cutouts 14 can be optionally implemented in the form of regular oblong holes or narrow rectangles, as shown in FIG. 4 by way of example. As outlines for the cutouts 14, virtually any shapes resulting in a low spring rate in the axial direction of the tubular spring are possible. Thus the cutouts can also be implemented e.g. as oblong cutouts with semicircular ends.

The tubular spring can be produced e.g. from a seamless drawn steel tube with a thickness of 1.0 mm or less. A steel tube with a thickness of more than 1.0 mm is particularly suitable when a lower-strength steel is used.

In order to increase the strength of the tubular spring after the laser cutting operation, heat treatment can be performed. As an alternative to the straight-line abutting edges of the tubular spring 12 shown in FIG. 2, any other abutting edge shapes can be formed, e.g. in the form of a sine wave or zigzag line, a correspondingly shaped weld or a spot weld then being used to fix the tubular spring in position.

Instead of welding the tubular spring 12 into position, it can also be fixed by the upper and lower plates 6, 8, so that the abutting edges only bear on one another, thereby enabling an advantageous distribution of the compressive and spring forces to be produced in the hollow body.

Because of its compact design, an implementation of the actuator unit having an outer hollow body preferably implemented as a tubular spring, and in which the piezoelectric actuator is preloaded by means of upper and lower covers connected to the hollow body with a form and/or force fit, allows ease of transportation and easy installation and removal, e.g. in an injection valve of an internal combustion engine.

We claim:

1. A method for producing a tubular spring in the form of a hollow body, for preloading a piezoelectric actuator element of an actuator unit of a fuel injector, comprising: the step of providing a thin-walled seamless drawn steel tube, said tube having plurality of regularly disposed oblong cutouts by means of beam/jet cutting, wherein during beam/jet cutting a filler suitable to provide for a defined shaping of the beam/jet outlet edge and prevent damage to the opposite side is inserted in the hollow body, wherein a minimum distance between adjacent cutouts of two rows is greater than 0.3 times and less than one time the wall thickness of the cylindrical hollow body of the tubular spring.

2. The method according to claim 1, wherein the beam/jet cutting is performed by a method selected from the group consisting of laser beam, waterjet or electron beam cutting.

3. The method according to claim 1, wherein a longitudinal extension direction of each cutout is in each case essentially oriented perpendicularly to a cylinder center line of the tubular spring.

4. The method according to claim 1, wherein the cutouts are disposed in rows, the cutouts of adjacent rows each being laterally offset to one another.

5. The method according to claim 1, wherein the seamless drawn steel tube used for the tubular spring has a thickness of less than 1.0 millimeters.

6. The method according to claim 1, wherein a spring steel is used as the material of the seamless drawn steel tube used for the tubular spring.

7. The method according to claim 1, wherein the tubular spring is provided with cutouts which more specifically have dumbbell-shaped outlines with a narrowed-down central area.

* * * * *